United States Patent [19]
Moreshead et al.

[11] Patent Number: 5,959,396
[45] Date of Patent: Sep. 28, 1999

[54] HIGH CURRENT NOVA DUAL SLIT ELECTRODE ENCHANCEMENT

[75] Inventors: Wylie K. Moreshead, Nevada; Walter J. Edmonds, Allen, both of Tex.

[73] Assignee: Texas Instruments Incorporated, Dallas, Tex.

[21] Appl. No.: 08/951,717

[22] Filed: Oct. 16, 1997

Related U.S. Application Data

[60] Provisional application No. 60/030,405, Oct. 29, 1996.

[51] Int. Cl.⁶ .................................................... H05H 1/00
[52] U.S. Cl. ................................ 313/363.1; 313/360.1; 313/361.1
[58] Field of Search .............................. 250/285, 492.21, 250/492.2 R, 298, 398, 251, 492.3, 423 R, 426; 313/231.31, 363.1, 360.1, 361.1, 362.1; 315/111.21, 111.31, 111.41, 111.51, 111.81, 248; 204/285.86, 629–30; 422/82.03

[56] References Cited

U.S. PATENT DOCUMENTS

| 4,847,504 | 7/1989 | Aitken | 250/492.2 |
| 5,017,835 | 5/1991 | Oechsner | 313/231.31 X |
| 5,399,871 | 3/1995 | Ito et al. | 250/492.21 |

*Primary Examiner*—Sandra O'Shea
*Assistant Examiner*—Mark Haynes
*Attorney, Agent, or Firm*—Mark A. Valetti; Carlton H. Hoel; Richard L. Donaldson

[57] ABSTRACT

A suppression electrode assembly (18) comprises an electrode suppression plate (40) constructed of a material having substantial strength and durability and has an aperture seat (76) with an opening (72) defined therein. An aperture insert (80) constructed from graphite is slidably engageable with the aperture seat (76). The aperture insert (80) defines an elongated slit (84) which is in general alignment with the aperture seat opening (72) when the aperture insert (80) is installed in the seat (76).

15 Claims, 2 Drawing Sheets

HIGH CURRENT NOVA DUAL SLIT ELECTRODE ENCHANCEMENT

This application is related to provisional application No. 60/030,405, filed Oct. 29, 1996.

TECHNICAL FIELD OF THE INVENTION

This invention is related in general to the field of semiconductor processing equipment. More particularly, the invention is related to an ion implantation suppression electrode assembly.

BACKGROUND OF THE INVENTION

Ion implantation is an important processing step in manufacturing semiconductor devices. In the ion implantation process, a beam of impurity ions is accelerated to kinetic energies ranging from several keV to several MeV and directed onto the surface of the semiconductor. A typical ion implanter ionizes the desired impurity gas in an arc chamber and the ions are extracted by an energized extraction electrode assembly into an acceleration tube toward the semiconductor.

The extraction electrode assembly typically includes two electrodes, a suppression electrode and an extraction electrode. As the ions are drawn out of the arc chamber or ion source, they pass through an aperture in the suppression electrode and toward an aperture in the extraction electrode. The majority of the ions pass through the extraction electrode aperture, but some strike the extraction electrode and generate secondary electrons. These secondary electrons are drawn by the highly positive source and accelerate toward it. The striking of the secondary electrons on the ion source would have resulted in the release of X-rays. However, these secondary electrons are stopped by the suppression electrode so that the generation of X-rays is greatly minimized.

In addition to extracting the ions from the arc chamber, the extraction electrode assembly further performs beam steering and focusing functions. The extraction electrode can be tilted and moved relative to the stationary ion source to center and focus the ion beam.

Because the suppression electrode is subjected to bombardment of high energy ions, the aperture is worn down quickly. A worn aperture may no longer have a well-defined opening and cannot steer and focus the ion beam in an effective manner. Because the suppression electrode is manufactured from a fragile material, typically graphite, careless mishandling also can easily damage the aperture and the electrode itself. Carelessness during the alignment process while installing the suppression electrode also may chip the aperture. When the aperture is damaged, the entire suppression electrode must be replaced, which is costly. Further, because of the porous and hydrophilic properties of graphite, substantial time is required to completely pump out the extraction chamber and out gas the suppression electrode after maintenance and servicing.

SUMMARY OF THE INVENTION

Accordingly, there is a need for a more durable and cost effective suppression electrode.

In accordance with the present invention, a suppression electrode assembly is provided which eliminates or substantially reduces the disadvantages associated with prior suppression electrodes used in ion implanters.

In one aspect of the invention, a suppression electrode assembly comprises an electrode suppression plate constructed of a material having substantial strength and durability and has an aperture seat with an opening defined therein. An aperture insert constructed from graphite is slidably engageable with the aperture seat. The aperture insert which defines an elongated slit is in general alignment with the opening in the aperture seat when the aperture insert is installed in the seat.

A technical advantage of the present invention is the durability of the suppression electrode and the disposability of the aperture insert. When worn or damaged beyond acceptable limits, the fragile aperture inserts may be replaced easily with a new one. Because the suppression electrode plate is constructed from durable materials such as stainless steel, it is substantially more resistance to possible damage caused by mishandling. Further, since the suppression electrode is constructed from a less porous and hydrophilic material than graphite, considerably less time is required to evacuate the extraction chamber to achieve vacuum after maintenance and servicing.

BRIEF DESCRIPTION OF THE DRAWINGS

For a better understanding of the present invention, reference may be made to the accompanying drawings, in which.

DETAILED DESCRIPTION OF THE INVENTION

Figure 1:
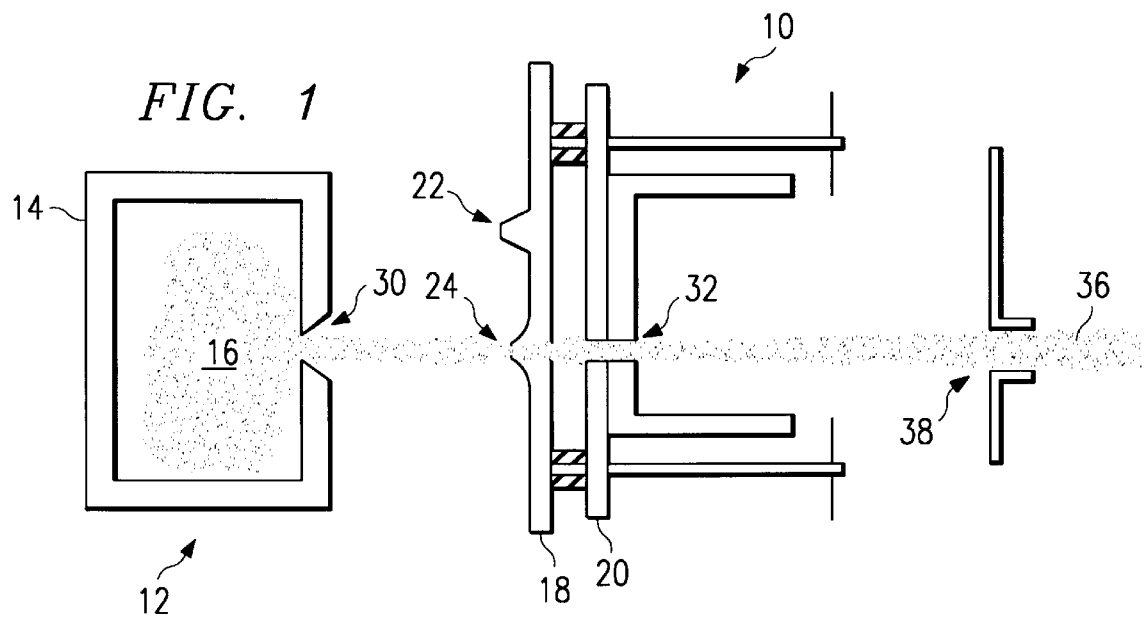
FIG. 1 is a simplified block diagram of an ion source and extraction electrode assembly.

The preferred embodiment(s) of the present invention is (are) illustrated in FIGS. 1–6, like reference numerals being used to refer to like and corresponding parts of the various drawings.

Referring to FIG. 1, an extraction electrode assembly 10 is shown positioned in front of an ion source 12. Ion source 12 is an arc chamber 14 containing an highly energized and ionized impurity gas 16, such as boron. Extraction electrode assembly 10 includes a first electrode 18 placed at a predetermined distance in front of arc chamber 14, and a second electrode 20 placed behind first electrode 18. First electrode 18 is commonly called the suppression electrode, and second electrode 20 is commonly called the extraction electrode.

Suppression electrode 18 may have more than one aperture to allow the passage of extracted ions at different energies. When suppression electrode 18 has two apertures 22 and 24, it is sometimes referred to as a dual-slit electrode, such as one used in model NV-20A manufactured by Eaton Corporation, Beverly, Mass. Typically, suppression electrode 18 is constructed out of an inert but fragile material, such as graphite.

In operation, extraction electrode 20 is charged and maintained at a voltage significantly lower or more negative than the arc chamber potential to attract and extract the positive ions 16 out of arc chamber 14 through an arc chamber aperture 30. The ions then pass through aperture 22 or 24 in suppression electrode 18 and pass through an aperture 32 in extraction electrode 20. Some of the ions strike electrode 20 and generate secondary electrons. These electrons are stopped from rebounding and hitting arc chamber 14 by suppression electrode 18, which is maintained at a more negative potential than extraction electrode 20. The X-rays that would otherwise have been generated by the secondary electrons hitting arc chamber 14 are thus substantially reduced or eliminated. The resultant stream of extracted ions form an ion beam 36, which travels through downstream equipment of the ion implanter toward the target semiconductor (not shown).

Extraction electrode assembly 10 can be displaced or moved along three axis to steer and focus ion beam 36 through a source housing aperture 38, so that the majority of the ions pass through aperture 38 and are in good alignment with downstream equipment in the ion implanter.

Figure 2:
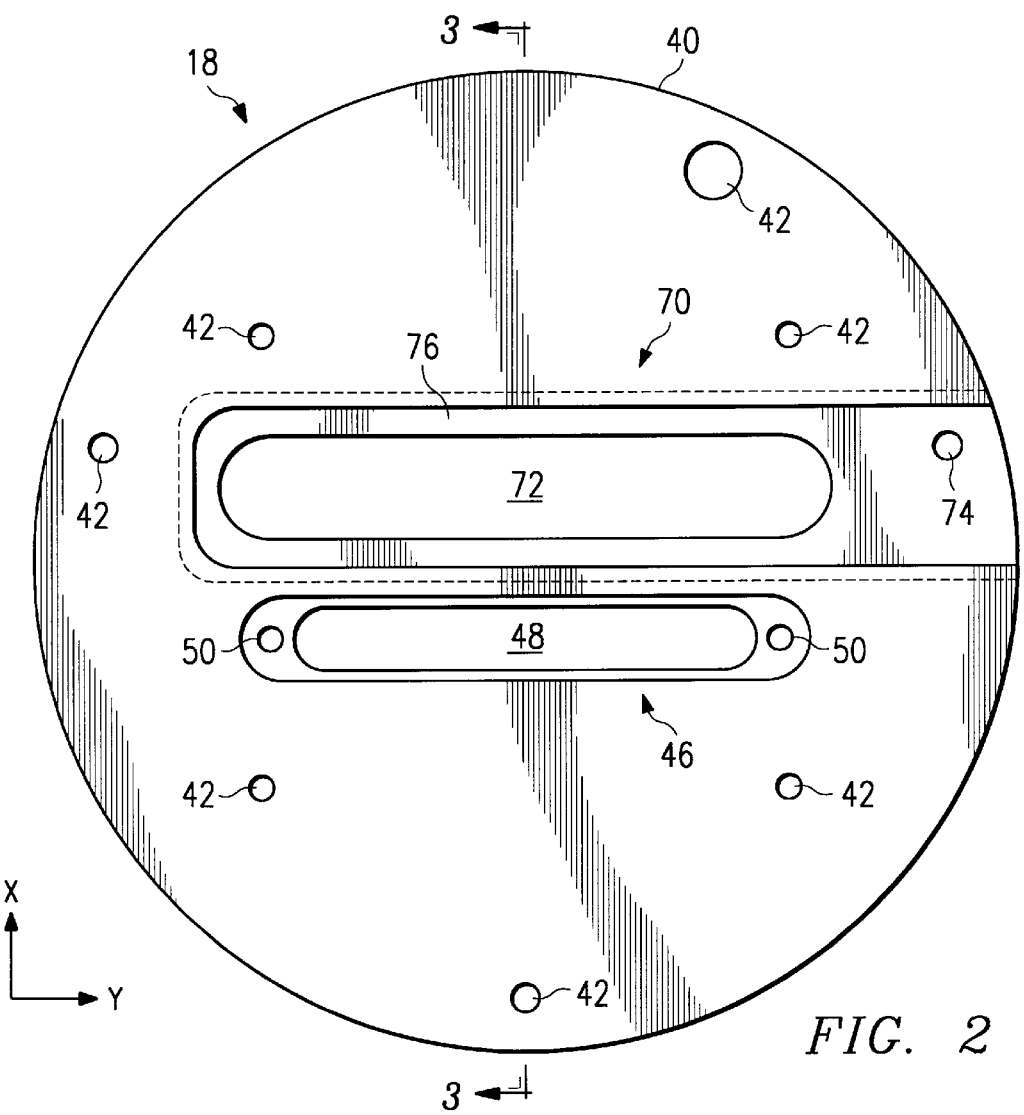
FIG. 2 is a top view of a suppression plate constructed according to the teachings of the present invention.

Referring to FIG. 2, a top view of suppression electrode 18 constructed according to the teachings of the present invention is shown. Suppression electrode 18 includes an electrode suppression plate 40 constructed from a material with suitable mechanical, chemical, and thermal properties. For example, it is desirable to use a material that does not warp or have high thenmionic emissions when subjected to temperatures experienced in the extraction chamber. In one embodiment of the present invention, stainless steel has been selected as the material used to fashion electrode suppression plate 40 therefrom. Electrode suppression plate 40 constructed from stainless steel can withstand large forces and can be easily cleaned. Conventional electrode suppression plates 40 are constructed from graphite, which is fragile, easily contaminated, and more difficult to clean.

Electrode suppression plate 40 preferably has a flat disc profile and includes a number of through holes 42 located at predetermined locations for receiving fasteners therethrough to securely hold electrode suppression plate 40 in extraction electrode assembly 10 (FIG. 1). It is obvious that the number, location and size of through holes 42, some of which may be countersunk, is deteimined by the nature of the seat or fixture (not shown explicitly) that receives suppression electrode 18.

A first seat 48 for a first aperture 46 (aperture insert not shown) may be provided. In an ion implanter, model NV-20A, manufactured by Eaton Corporation, Beverly, Mass., aperture 46 is for extracting ions biased at a first range of voltage potential, for example, voltage levels greater than 30 KeV. Aperture seat 48 may include one or more openings 50 for receiving fasteners (not shown) to secure the insert therein.

Figure 3:
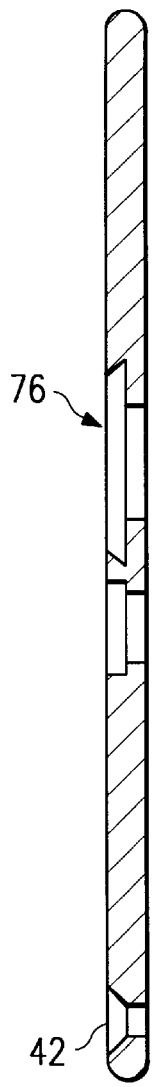
FIG. 3 is a cross-sectional side view of the suppression plate taken along lines 3—3 in FIG. 2.
Figure 4:
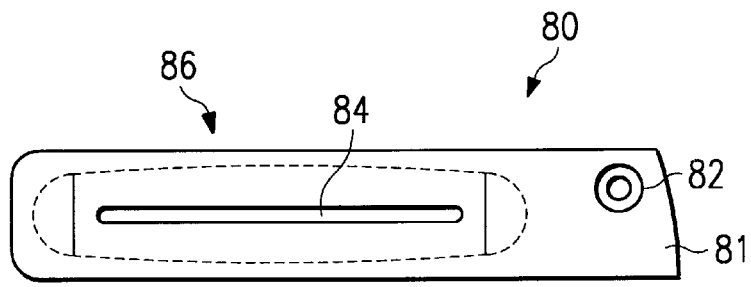
FIG. 4 is a top view of an aperture insert constructed according to the teachings of the present invention.
Figure 5:
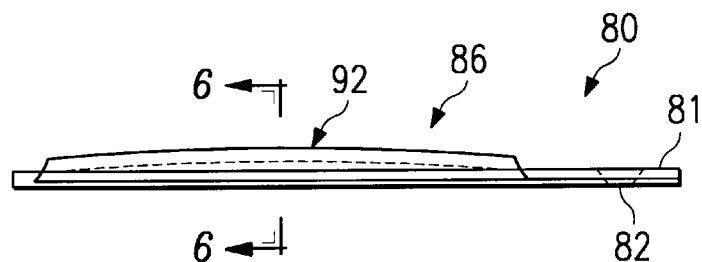
FIG. 5 is a side view of the aperture insert constructed according to the teachings of the present invention.
Figure 6:
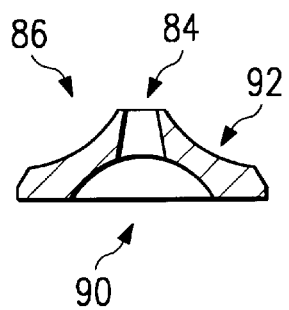
FIG. 6 is a cross-sectional view of the aperture insert taken along 6—6 in FIG. 5.

Also provided is a second aperture 70, which includes a seat 76 for receiving an aperture insert. The aperture insert is shown in FIGS. 4–6 and described in more detail below. Aperture 70 includes an elongated opening 72 and at least one opening 74 for receiving a fastener (not shown). FIG. 3 is a cross-sectional view of electrode suppression plate 40 along line 3—3 in FIG. 2. Seat 76 extends to the perimeter of electrode suppression plate 40 to allow the aperture insert to be positioned in seat 76 by sliding it from the perimeter toward the center of plate 40.

Referring to FIGS. 4–6, a top, side and cross-sectional view of an aperture insert 80 is shown, respectively. Aperture insert 80 includes a bottom plate 81 from which a generally domed aperture portion 86 arises. Bottom plate 81 is shaped and sized to slidably engage seat 76 formed in suppression electrode plate 40. It may be seen that aperture insert 80 may engage seat 76 from the perimeter of electrode suppression plate 40 and may be slid into seat 76. Once seated, aperture insert 80 cannot be removed by turning electrode suppression plate 40 upside down since the top lip of seat 76 is narrower than the bottom.

At least one opening 82 is formed in bottom plate 81 of aperture insert, which corresponds in size and position with opening 74 formed in seat 76 for receiving a fastener. The use of a fastener, such as a bolt or screw, secures aperture insert 80 to electrode suppression plate 40. Opening 74 may be countersunk. The desirable insert material preferably does not contain elements that are mobile in the semiconductor crystal lattice, such as chromium, nickel, and aluminum. Preferably, aperture insert 80 is fashioned from graphite or any other suitable material that is not electrically active in silicon.

Domed portion 86 of aperture insert 80 includes an elongated slit 84 of a predetermined width and length for the passage of accelerated ions from the ion source to their target. Domed portion 86 is substantially hollow with an elongated and domed void 90 that has a generally semicircular cross-section. Void 90 echoes the shape of elongated slit 84 and is connected thereto, forming a continuous passageway through aperture insert 80. Dome portion 86 may further have a generally curved top surface 92 having a predetermined degree of curvature. This curvature is again echoed in the ceiling of void 90.

Constructed in this manner, aperture insert 80 may be easily replaced by a new insert when it is worn or damaged beyond the required specifications. Electrode suppression plate 40, because of the strength and more durable properties of stainless steel, can be used and reused many times as a more permanent fixture with replacement aperture inserts. Aperture inserts may be replaced without the removal and realignment of the entire suppression electrode 18, thus reducing the likelihood of contamination and increase the efficiency and speed of system maintenance. Less time and effort is also required to pump out the extraction chamber because the electrode suppression plate is fashioned from a less porous and hydrophilic material than graphite, such as stainless steel. As a result, the cost of operating the ion implanter is significantly reduced.

Although the present invention and its advantages have been described in detail, it should be understood that various changes, substitutions and alterations can be made therein without departing from the spirit and scope of the invention as defined by the appended claims.

What is claimed is:

1. A suppression electrode for an ion implanter, comprising:

an electrode suppression plate constructed of a material having substantial strength and durability, said electrode suppression plate having an aperture seat with an opening defined therein; and an aperture insert defining an elongated slit, said aperture insert being slidably engageable with said aperture seat, so that said elongated slit thereof is in general alignment with said opening in said aperture seat for the passage of accelerated ions.

2. The suppression electrode, as set forth in claim 1, wherein said electrode suppression plate is constructed from stainless steel.

3. The suppression electrode, as set forth in claim 1, wherein said electrode suppression plate is constructed from a metal.

4. The suppression electrode, as set forth in claim 1, wherein said aperture insert is constructed from graphite.

5. The suppression electrode, as set forth in claim 1, wherein said aperture insert is constructed from a material which is non-electrically active in silicon.

6. The suppression electrode, as set forth in claim 1, wherein said aperture insert comprises:

a bottom plate being slidably engageable with said aperture seat;

a domed portion defining an elongated void extending substantially the length of said opening in said aperture seat, said domed portion further defining said elongated slit through the top of said domed portion and in communications and alignment with said elongated void.

7. The suppression electrode, as set forth in claim 6, wherein said bottom plate, when seated in said aperture seat, extends to the perimeter of said electrode suppression plate.

8. A suppression electrode assembly, comprising:

an electrode suppression plate constructed of a material having substantial strength and durability, said electrode suppression plate having an aperture seat with an opening defined therein; and an aperture insert constructed from graphite and defining an elongated slit, said aperture insert being slidably engageable with said aperture seat, so that said elongated slit thereof is in general alignment with said opening in said aperture seat.

9. The suppression electrode, as set forth in claim 8, wherein said electrode suppression plate is constructed from stainless steel.

10. The suppression electrode, as set forth in claim 8, wherein said electrode suppression plate is constructed from a metal.

11. The suppression electrode, as set forth in claim 8, wherein said aperture insert comprises:

a bottom plate being slidably engageable with said aperture seat;

a domed portion defining an elongated void extending substantially the length of said opening in said aperture seat, said domed portion further defining said elongated slit through the top of said domed portion and in communications and alignment with said elongated void.

12. The suppression electrode, as set forth in claim 11, wherein said bottom plate, when seated in said aperture seat, extends to the perimeter of said electrode suppression plate.

13. A suppression electrode, comprising:

an electrode suppression plate constructed of stainless steel, said electrode suppression plate having an aperture seat with an opening defined therein; and a disposable aperture insert constructed from graphite and defining an elongated slit, an electrode suppression plate constructed of stainless steel, said electrode suppression plate having an aperture seat with an opening defined therein; and a disposable aperture insert constructed from graphite and defining an elongated slit, said aperture insert being slidably engageable with said aperture seat, so that said elongated slit thereof is in general alignment with said opening in said aperture seat.

14. The suppression electrode, as set forth in claim 13, wherein said aperture insert comprises:

a bottom plate being slidably engageable with said aperture seat;

a domed portion defining an elongated void extending substantially the length of said opening in said aperture seat, said domed portion further defining said elongated slit through the top of said domed portion and in communications and alignment with said elongated void.

15. The suppression electrode, as set forth in claim 13, wherein said bottom plate, when seated in said aperture seat, extends to the perimeter of said electrode suppression plate.

* * * * *